US011302575B2

(12) United States Patent
Anderson et al.

(10) Patent No.: US 11,302,575 B2
(45) Date of Patent: Apr. 12, 2022

(54) SUBTRACTIVE LINE WITH DAMASCENE SECOND LINE TYPE (71) Applicant: International Business Machines Corporation, Armonk, NY (US)

(72) Inventors: Brent Anderson, Jericho, VT (US); Christopher J Penny, Saratoga Springs, NY (US); Lawrence A. Clevenger, Saratoga Springs, NY (US); Nicholas Anthony Lanzillo, Wynantskill, NY (US); Kisik Choi, Watervliet, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/941,860

(22) Filed: Jul. 29, 2020

(65) Prior Publication Data
US 2022/0037205 A1 Feb. 3, 2022

(51) Int. Cl.
*H01L 21/768* (2006.01)
*H01L 23/528* (2006.01)
*H01L 23/532* (2006.01)

(52) U.S. Cl.
CPC .. *H01L 21/76885* (2013.01); *H01L 21/76834* (2013.01); *H01L 21/76877* (2013.01); *H01L 23/5283* (2013.01); *H01L 21/7685* (2013.01); *H01L 21/76843* (2013.01); *H01L 23/53228* (2013.01); *H01L 23/53257* (2013.01)

(58) Field of Classification Search
CPC ......... H01L 21/76885; H01L 21/76834; H01L 21/76877; H01L 23/5283; H01L 21/7685; H01L 23/53228; H01L 21/76843; H01L 23/53257
See application file for complete search history.

(56) References Cited

U.S. PATENT DOCUMENTS

| 9,601,426 | B1 | 3/2017 | Bonilla et al. |
| 9,613,861 | B2 | 4/2017 | Anderson et al. |
| 9,786,597 | B2 | 10/2017 | Chang et al. |
| 10,199,264 | B2 | 2/2019 | Zhang et al. |
| 2007/0077761 | A1* | 4/2007 | Lehr ................ H01L 21/76844 438/687 |
| 2009/0246706 | A1 | 10/2009 | Hendel et al. |
| 2011/0059403 | A1 | 3/2011 | Sukekawa |

(Continued)

OTHER PUBLICATIONS

Michael C. Smayling et al., "32nm and below logic patterning using optimized illumination and double patterning," Proc. SPIE 7274, vol. 7274, Mar. 2009, 72740K, 8 pp.

*Primary Examiner* — Karen Kusumakar
(74) *Attorney, Agent, or Firm* — Samuel Waldbaum; Michael J. Chang, LLC (57) ABSTRACT

Interconnect structures having subtractive line with damascene second line type are provided. In one aspect, an interconnect structure includes: first metal lines of a first line type disposed on a substrate; and at least one second metal line of a second line type disposed on the substrate between two of the first metal lines, wherein the first line type includes subtractive lines and the second line type includes damascene lines such that the first metal lines have a different metallization structure from the at least one second metal line. A method of forming an interconnect structure is also provided.

20 Claims, 5 Drawing Sheets

(56) References Cited

U.S. PATENT DOCUMENTS

| | | |
|---|---|---|
| 2017/0040216 A1 | 2/2017 | Anderson et al. |
| 2017/0040257 A1 | 2/2017 | Bruce et al. |
| 2018/0076133 A1 | 3/2018 | Bonilla et al. |
| 2018/0366370 A1 | 12/2018 | Pellizzer et al. |
| 2021/0313262 A1* | 10/2021 | Fu .................... H01L 21/76877 |

* cited by examiner

SUBTRACTIVE LINE WITH DAMASCENE SECOND LINE TYPE

FIELD OF THE INVENTION

The present invention relates to interconnect structures, and more particularly, to interconnect structures having subtractive line with damascene second line type.

BACKGROUND OF THE INVENTION

Patterning is reaching minimum pitch limits, thus requiring advances in the technology to continue density scaling. For instance, pitch multiplying techniques such as sidewall image transfer (SIT), self-aligned double patterning (SADP), self-aligned quadruple patterning (SAQP), and other self-aligned multiple patterning (SAMP) techniques can be employed for patterning at a sub-lithographic pitch. These patterning schemes create a hard mask with pitch multiplying features.

However, the process for implementing a hard mask with pitch multiplying features is extremely complex and requires very high aspect ratio etches. Minimum dielectric thickness between the metal lines is also affected by the high variability of the process. A thinner dielectric reduces the maximum voltage which can be supported.

Thus, improved pitch multiplying techniques that avoid use of a complex hardmask process would be desirable.

SUMMARY OF THE INVENTION

The present invention provides interconnect structures having subtractive line with damascene second line type. In one aspect of the invention, an interconnect structure is provided. The interconnect structure includes: first metal lines of a first line type disposed on a substrate; and at least one second metal line of a second line type disposed on the substrate between two of the first metal lines, wherein the first line type includes subtractive lines and the second line type includes damascene lines such that the first metal lines have a different metallization structure from the at least one second metal line.

In another aspect of the invention, a method of forming an interconnect structure is provided. The method includes: depositing a metal layer onto a substrate; subtractive patterning the metal layer into first metal lines; and forming at least one second metal line between two of the first metal lines using a damascene process.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming metal lines that combine 1) a subtractive line etch with 2) dielectric spacers isolating lines and 3) a damascene line fill to simplify the hard mask process and also improve the aspect ratio for the line etch step. Advantageously, the final damascene metal fill results in pitch multiplying without requiring multiplied features at the hard mask step. Additional advantages include relaxed dielectric spacer deposition process for improved line-to-line spacing tolerance. Based on the present approach, the subtractive etched and damascene metal lines will have unique and distinctly different metallization structures such as different barrier layer configurations, different metal line heights, different dimensions, different metals for alternating line types, etc. The term 'metallization structure' as used herein refers to the metal lines and associated structures such as barrier layers.

Figure 1:
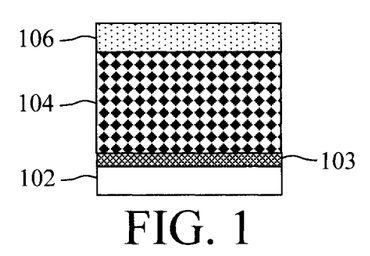
FIG. 1 is a cross-sectional diagram illustrating an optional barrier layer having been deposited onto a substrate, a metal layer having been deposited onto the substrate over the optional barrier layer, and a capping layer having been deposited onto the metal layer according to an embodiment of the present invention.
Figure 2:
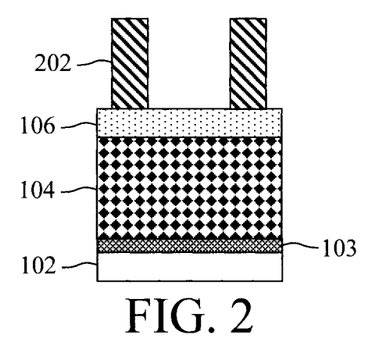
FIG. 2 is a cross-sectional diagram illustrating a hardmask having been formed on the capping layer according to an embodiment of the present invention.

An exemplary methodology for forming an interconnect structure in accordance with the present techniques is now described by way of reference to FIGS. 1-7. As shown in FIG. 1, the process begins with the deposition of a metal layer 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Optionally, a barrier layer 103 can be deposited onto the substrate 102 prior to depositing the metal layer 104. In that case, the barrier layer 103 will be present between substrate 102 and metal layer 104. The use of a barrier layer 103 helps to prevent diffusion of the metal(s) from layer 104 into the substrate 102. Suitable barrier layer materials include, but are not limited to, tantalum (Ta), tantalum nitride (TaN), titanium (Ti), and/or titanium nitride (TiN). A process such as chemical vapor deposition (CVD), atomic layer deposition (ALD), or physical vapor deposition (PVD) can be employed to deposit the barrier layer 103 onto the substrate 102. According to an exemplary embodiment, barrier layer 103 has a thickness of from about 2 nanometers (nm) to about 5 nm and ranges therebetween.

Suitable metals for metal layer 104 include, but are not limited to, cobalt (Co), ruthenium (Ru) and/or tungsten (W). As will be described in detail below, subtractive etching will be employed to pattern the metal layer 104 into a plurality of individual metal lines (a first line type). It is notable that metals such as copper (Cu) are not easily patterned in this manner. Namely, Cu does not provide any volatile product while reacting with common etchant gases (fluorine, chlorine, oxygen, hydrogen etc.). As a result, it has a very slow etch rate to enable subtractive etching of Cu lines. Thus, alternative metals such as Co and/or Ru are preferably employed.

A process such as evaporation, sputtering or electrochemical plating can be employed to deposit the metal layer 104 onto the barrier layer 103, if present, or otherwise directly on the substrate 102. According to an exemplary embodiment, metal layer 104 has a thickness of from about 10 nm to about 50 nm and ranges therebetween.

A capping layer 106 is next deposited onto the metal layer 104. Capping layer 106 will serve to protect the subtractive metals during damascene formation of the second line type (see below). Suitable materials for the capping layer 106 include, but are not limited to, nitride materials such as silicon nitride (SiN), silicon oxynitride (SiON) and/or silicon oxycarbonitride (SiOCN) and/or oxide materials such as silicon oxide (SiOx) and/or silicon oxycarbide (SiCO). A process such as CVD, ALD or PVD can be employed to deposit the capping layer 106 onto the metal layer 104. According to an exemplary embodiment, the capping layer 106 has a thickness of from about 5 nm to about 10 nm and ranges therebetween.

As highlighted above, a subtractive etch is then performed to pattern the metal layer 104 into individual metal lines (i.e., a first line type). To do so, a patterned hardmask 202 is next formed on the capping layer 106. See FIG. 2. Hardmask 202 can be formed using lithography and etching processes. Namely, with lithography and etching processes, a lithographic stack (not shown), e.g., photoresist/organic planarizing layer (OPL)/anti-reflective coating (ARC), is used to pattern the hardmask 202 with the footprint and location of the metal lines. Suitable hardmask materials include, but are not limited to, nitride hardmask materials such as SiN, SiON, silicon carbide nitride (SiCN), and/or oxide hardmask materials such as SiOx.

Figure 3:
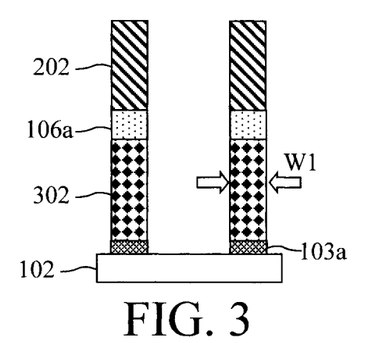
FIG. 3 is a cross-sectional diagram illustrating an etch having been used to form first metal lines according to an embodiment of the present invention.
Figure 4:
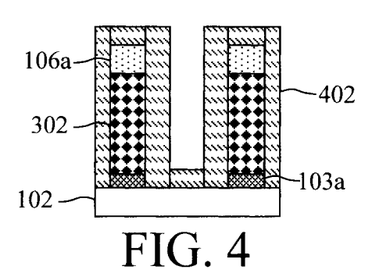
FIG. 4 is a cross-sectional diagram illustrating a layer of a spacer material having been deposited over the first metal lines according to an embodiment of the present invention.

An etch is then used to transfer the pattern from the hardmask 202 to the underlying capping layer 106, metal layer 104, and (optional) barrier layer 103 if present, forming first metal lines 302. See FIG. 3. A directional (anisotropic) etching process such as reactive ion etching (RIE) can be employed for the etch. The patterned portions of the (optional) barrier layer and capping layer below and above the first metal lines 302 are now given the reference numerals 103a and 106a, respectively. As shown in FIG. 3, the capping layer 106a is present on each of the first metal lines 302. Following patterning of the first metal lines 302, the hardmask 202 is removed. It is notable that, while FIG. 3 depicts the etch being endpointed precisely on substrate 102, a certain amount of over-etch may be expected. As will be described in detail below, this over-etch will lead to a unique metallization structure whereby the damascene metal lines are deeper than the subtractive metal lines. To look at it another way, a bottom of the subtractive metal lines will be offset from a bottom of the damascene metal lines.

As shown in FIG. 3, first metal lines 302 have a width W1. According to an exemplary embodiment, W1 is from about 5 nm to about 15 nm and ranges therebetween. As will be described in detail below, embodiments are also presented herein where the widths of the metal lines are varied, e.g., to produce metal lines having at least two different widths.

The next task is to form spacers alongside the first metal lines 302. To do so, layer 402 of a spacer material is first conformally deposited over the first metal lines 302. See FIG. 4. Suitable spacer materials include, but are not limited to, SiN, SiON, SiCN, SiOx, silicon carbide (SiC) and/or SiCO. A process such as CVD, ALD or PVD can be employed to deposit the layer 402 of spacer material. According to an exemplary embodiment, layer 402 has a thickness of from about 2 nm to about 15 nm and ranges therebetween.

A directional (anisotropic) etch such as RIE is then employed to pattern layer 402 into individual spacers 502 along the sidewalls of first metal lines 302. See FIG. 5. As will become apparent from the description that follows, these spacers 502 will separate the first metal lines 302 (first line type by subtractive patterning) from the second line type by a damascene process. Notably, a trench 504 is now present between the first metal lines 302/spacers 502. It is this trench 504 that will be filled with a metal(s) to form a second (damascene) line type.

Figure 5:
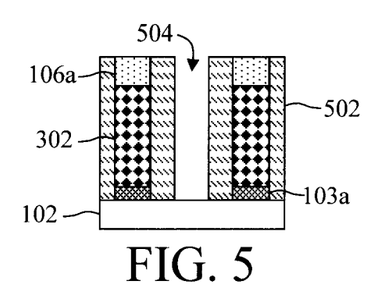
FIG. 5 is a cross-sectional diagram illustrating the layer of spacer material having been patterned into individual spacers along the sidewalls of the first metal lines according to an embodiment of the present invention.

Optionally, according to an alternate embodiment described below, the spacers 502 can be removed following formation of the second line type and replaced with a final 'replacement' spacer. In that case, spacers 502 may also be referred to herein as 'sacrificial spacers.' The term 'sacrificial' as used herein refers to a structure that is removed, in whole or in part, during the fabrication process.

Figure 18:
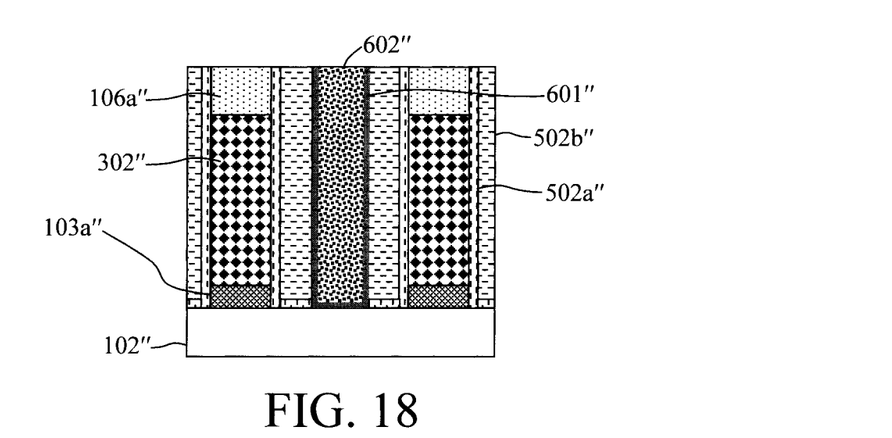
FIG. 18 is a cross-sectional diagram illustrating, according to a further alternative embodiment, a bilayer spacer configuration according to an embodiment of the present invention.

As will be described in detail below, the spacers 502 can optionally be formed from a combination of layers. For instance, according to an alternative embodiment described below, a bilayer spacer is formed having a first dielectric disposed over the first metal lines, and at least a second dielectric disposed over the first dielectric. With this bilayer spacer configuration, the first dielectric is present along the sidewall of the first metal lines, while the second dielectric is present along the sidewall of the second metal line.

Figure 6:
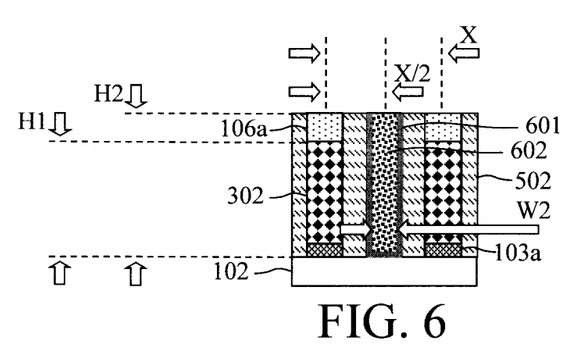
FIG. 6 is a cross-sectional diagram illustrating a second metal line having been formed in between the first metal lines, whereby the spacers separate the first metal lines from the second metal line according to an embodiment of the present invention.

A damascene process is then employed to form a second metal line 602 in between the first metal lines 302, whereby the spacers 502 separate the first metal lines 302 from the second metal line 602. See FIG. 6. The term 'damascene' as used herein refers to the metallization process whereby a feature such as trench 504 is filled with a metal or a combination of metals to form an interconnect such as second metal line 602. Suitable metals for a damascene process include, but are not limited to, copper (Cu), Co, Ru and/or W. The metal(s) can be deposited into trench 504 using a process such as evaporation, sputtering or electrochemical plating. Following deposition, the metal overburden can be removed using a process such as chemical-mechanical polishing (CMP). Notably, as shown in FIG. 6, following CMP the top surfaces of the second metal line 602, the capping layer 106a and the spacers 502 are coplanar. See FIG. 6.

As also shown in FIG. 6, second metal line 602 has a width W2. According to an exemplary embodiment, W2 is from about 5 nm to about 15 nm and ranges therebetween. As will be described in detail below, embodiments are also presented herein where the widths of the metal lines are varied, e.g., to produce metal lines having at least two different widths.

As further shown in FIG. 6, the first metal lines 302 have a line height H1 and the second metal line 602 has a line height H2, wherein H2>H1. Thus, according to an exemplary embodiment, the first metal lines 302 have a different line height from the second metal line 602.

Prior to depositing the metal(s) into trench 504, a conformal barrier layer 601 can be deposited into and lining the trenches 504. Use of such a barrier layer 601 helps to prevent diffusion of the metal(s) into the surrounding spacers 502. The terms 'first' and 'second' may also be used herein when referring to (optional) barrier layer 103a and barrier layer 601. As provided above, suitable barrier layer materials include, but are not limited to, Ta, TaN, Ti, and/or TiN. Additionally, a seed layer (not shown) can be deposited into and lining the trench 504 prior to metal deposition. A seed layer can be used to facilitate plating of the metal into the trench 504.

As shown in FIG. 6, the present structure includes first metal lines 302 of a first (subtractive) line type and a second metal line 602 of a second (damascene) line type in between the first metal lines 302. In this case, if the first metal lines 302 have a pitch X, then the first metal lines 302 and the second metal line 602 have a combined pitch of X/2. See FIG. 6. The term 'pitch' as used herein refers to the distance between the same point on each of the metal lines 302/602.

It is notable that, while the figures illustrate a single second metal line 602, this is done for ease and clarity of depiction. It is to be understood that the present techniques can be employed to form multiple second metal lines 602, wherein each of the (multiple) second metal lines 602 is present between two of the first metal lines 302.

Spacers 502 separate the first metal lines 302 from the second metal line 602. If employed, the optional barrier layer 103a is present only at a bottom of the first metal lines 302, i.e., the barrier layer 103a separates the first metal lines 302 from the underlying substrate 102. By contrast, the barrier layer 601 is present at the bottom and along the sidewalls of the second metal line 602, i.e., the barrier layer 601 separates the second metal line 602 from the underlying substrate 102 as well as from the adjacent spacers 502. Another notable feature of the present design is that the first metal lines 302 can be formed from a different metal or a different combination of metals than the second metal line 602. For instance, the first metal line type can be chosen to optimize the compatibility with a RIE etch and the second metal line type can be chosen for the ability to fill narrow damascene trenches. While employing a different metal(s) for the first/second metal lines 302/602 is possible, embodiments are also contemplated herein where the same metal(s) is/are used for both the first metal lines 302 and the second metal line 602.

As highlighted above, the spacers 502 may in fact be sacrificial spacers that are used during the damascene process, and then later removed and replaced with final 'replacement' spacers. Doing so has some notable advantages, such as permitting replacement of the spacers 502 with a different dielectric material, and providing a high-quality dielectric to replace the spacers 502 that might have become damaged during the fabrication process.

Figure 7:
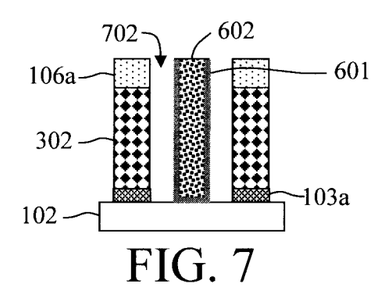
FIG. 7 is a cross-sectional diagram illustrating, according to an alternative embodiment, the spacers having been selectively removed according to an embodiment of the present invention.

This alternative embodiment is now described by way of reference to FIGS. 7 and 8. What is shown in FIG. 7 follows from the structure shown in FIG. 6, and thus like structures are numbered alike. As shown in FIG. 7, following formation of the second metal line 602, the spacers 502 (which in this alternative example are sacrificial spacers) are selectively removed, forming trenches 702 in between the first metal lines 302 and the second metal line 602. The terms 'first' and 'second' may also be used herein when referring to trench 504 and trenches 702, respectively. A directional (anisotropic) etching process such as RIE can be employed to selectively remove the spacers 502. It is notable that some choices in the material selection might facilitate this process. For instance, if an oxide material is selected for capping layer 106a, then use of a nitride material for spacers 502 would enable selective removal of the spacers 502. Conversely, if a nitride material is selected for capping layer 106a, then use of an oxide material for spacers 502 would enable selective removal of the spacers 502.

A spacer material is then deposited into the trenches 702 forming (replacement) spacers 802 in between the first metal lines 302 and second metal line 602. See FIG. 8. As provided above, suitable spacer materials include, but are not limited to, SiN, SiON, SiCN, SiOx, SiC and/or SiCO. A process such as CVD, ALD or PVD can be employed to deposit the spacer material into trenches 702. Following deposition, the spacer material can be planarized using a process such as CMP.

Figure 8:
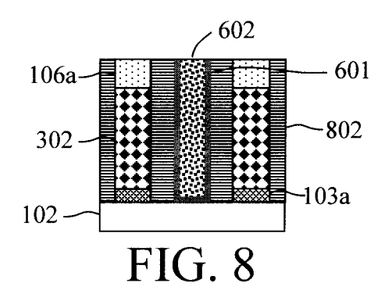
FIG. 8 is a cross-sectional diagram illustrating replacement spacers having been formed in between the first metal lines and the second metal line according to an embodiment of the present invention.

According to an exemplary embodiment, the dielectric material selected for replacement spacers 802 is different from that used for spacers 502. However, while employing different dielectric materials for the first/second spacers 502/802 is possible, embodiments are also contemplated herein where the same dielectric material is used for both the first spacers 502 and the second spacers 802.

In the above-described exemplary process flows, the first metal lines 302 and second metal line 602 formed have approximately the same width as one another, i.e., W1≈W2. However, the present techniques can also be implemented to vary the widths of the first metal lines 302 and/or second metal line 602. See, for instance, the alternative embodiment illustrated in FIGS. 9-14.

Figure 9:
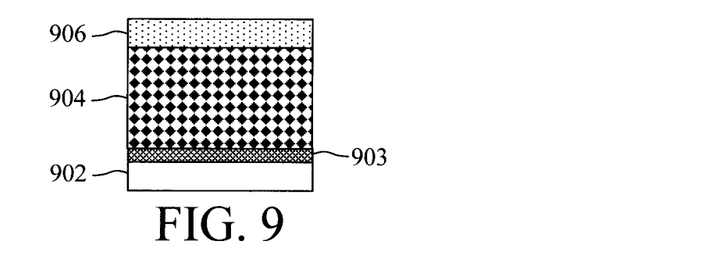
FIG. 9 is a cross-sectional diagram illustrating, according to another alternative embodiment, an optional barrier layer having been deposited onto a substrate, a metal layer having been deposited onto the substrate over the optional barrier layer, and a capping layer having been deposited onto the metal layer according to an embodiment of the present invention.
Figure 10:
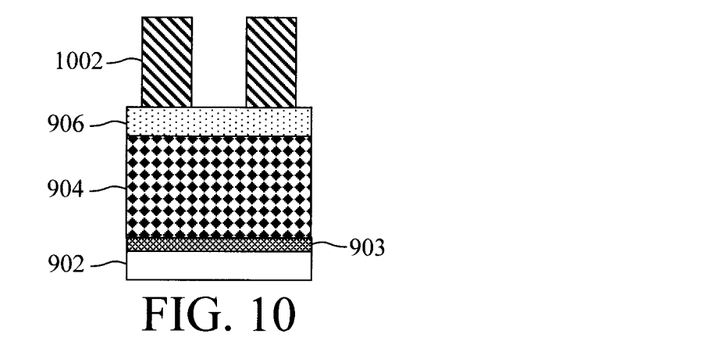
FIG. 10 is a cross-sectional diagram illustrating a hardmask having been formed on the capping layer according to an embodiment of the present invention.

The process follows the same general flow described above, and employs the same materials and processing steps. Thus, as shown in FIG. 9, a metal layer 904 (e.g., Co, Ru and/or W) is deposited onto a substrate 902, and a capping layer 906 (e.g., SiN, SiON, SiOCN, SiOx and/or SiCO) is deposited onto the metal layer 904. As above, the substrate 902 can be a bulk semiconductor wafer, such as a bulk Si, bulk Ge, bulk SiGe and/or bulk III-V semiconductor wafer, or an SOI wafer. Further, substrate 902 may already have pre-built structures (not shown) such as transistors, diodes, capacitors, resistors, isolation regions (e.g., STI regions), interconnects, wiring, etc. According to an exemplary embodiment, metal layer 904 has a thickness of from about 10 nm to about 50 nm and ranges therebetween, and the capping layer 906 has a thickness of from about 5 nm to about 10 nm and ranges therebetween.

As shown in FIG. 9, an optional barrier layer 903 (e.g., Ta, TaN, Ti, and/or TiN) can be deposited onto the substrate 902 prior to depositing the metal layer 904 such that the barrier layer 103 is present between the substrate 902 and the metal layer 904. According to an exemplary embodiment, barrier layer 903 has a thickness of from about 2 nm to about 5 nm and ranges therebetween.

Figure 11:
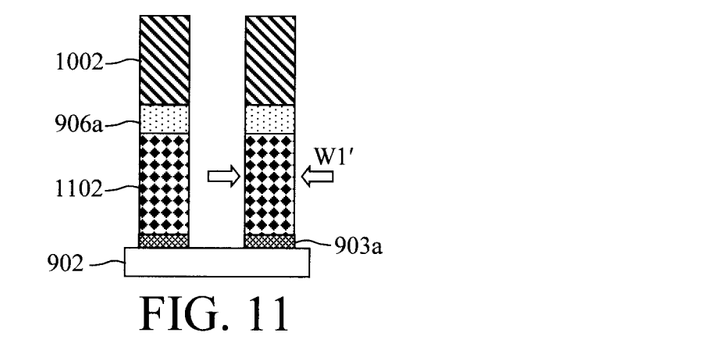
FIG. 11 is a cross-sectional diagram illustrating an etch having been used to form first metal lines having a width W1' according to an embodiment of the present invention.
Figure 12:
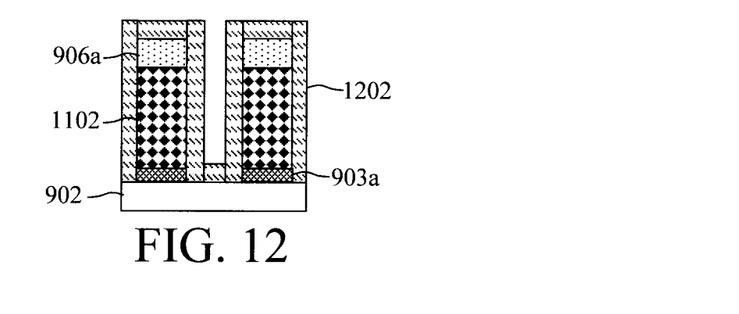
FIG. 12 is a cross-sectional diagram illustrating a layer of a spacer material having been deposited over the first metal lines according to an embodiment of the present invention.
Figure 13:
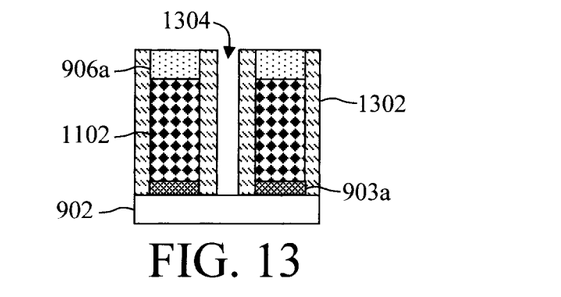
FIG. 13 is a cross-sectional diagram illustrating the layer of spacer material having been patterned into individual spacers along the sidewalls of the first metal lines according to an embodiment of the present invention.

In the same manner as described above, a subtractive etch is next performed to pattern the metal layer 904 into individual metal lines (i.e., a first line type). To do so, a patterned hardmask 1002 is next formed on the capping layer 906. See FIG. 10. An etch is then used to transfer the pattern from the hardmask 1002 to the underlying capping layer 906, metal layer 904, and (optional) barrier layer 903 if present, forming first metal lines 1102. See FIG. 11. A directional (anisotropic) etching process such as RIE can be employed for the etch. The patterned portions of the (optional) barrier layer and capping layer below and above the first metal lines 1102 are now give the reference numerals 903a and 906a, respectively. As shown in FIG. 11, the capping layer 906a is present on each of the first metal lines 1102. Following patterning of the first metal lines 1102, the hardmask 1002 is removed. It is notable that, while FIG. 11 depicts the etch being endpointed precisely on substrate 902, a certain amount of over-etch may be expected. As will be described in detail below, this over-etch will lead to a unique metallization structure whereby the damascene metal lines are deeper than the subtractive metal lines. To look at it another way, a bottom of the subtractive metal lines will be offset from a bottom of the damascene metal lines.

In the present example, the width of the first metal lines 1102 is increased from the previous example. For instance, in this case first metal lines 1102 have a width W1', wherein W1'>W1. Compare, for example, width W1 shown in FIG. 3. According to an exemplary embodiment, W1' is from about 10 nm to about 20 nm and ranges therebetween. As will be described in detail below, the width of the second metal line will be reduced so as to produce metal lines having at least two different widths.

The next task is to form spacers alongside the first metal lines 1102. To do so, layer 1202 of a spacer material (e.g., SiN, SiON, SiCN, SiOx, SiC and/or SiCO) is first confor-
mally deposited over the first metal lines 1102. See FIG. 12. According to an exemplary embodiment, layer 1202 has a thickness of from about 2 nm to about 15 nm and ranges therebetween.

A directional (anisotropic) etch such as RIE is then employed to pattern layer 1202 into individual spacers 1302 along the sidewalls of first metal lines 1102. See FIG. 13. In the same manner as above, these spacers 1302 will separate the first metal lines 1102 (first line type by subtractive patterning) from the second line type by a damascene process. Notably, a trench 1304 is now present between the first metal lines 1102/spacers 1302. It is this trench 1304 that will be filled with a metal(s) to form a second (damascene) line type.

Figure 14:
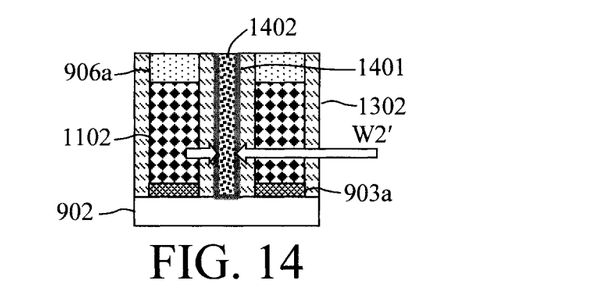
FIG. 14 is a cross-sectional diagram illustrating a second metal line with a width W2' having been formed in between the first metal lines, wherein W1'>W2', whereby the spacers separate the first metal lines from the second metal line according to an embodiment of the present invention.

A damascene process is then employed to form a second metal line 1402 in between the first metal lines 1102, whereby the spacers 1302 separate the first metal lines 1102 from the second metal line 1402. See FIG. 14. As provided above, with the damascene process trench 1304 is filled with a metal or a combination of metals to form the second metal line 1402. As provided above, suitable metals for second metal line 1402 include, but are not limited to, Cu, Co, Ru and/or W. Following deposition, the metal overburden can be removed using a process such as CMP. Following the CMP the top surfaces of the second metal line 1402, the capping layer 906a and the spacers 1302 are coplanar. See FIG. 14. As shown in FIG. 14, second metal line 1402 has a width W2'. According to an exemplary embodiment, W2' is from about 2 nm to about 10 nm and ranges therebetween.

Prior to depositing the metal(s) into trench 1304, a conformal barrier layer 1401 (e.g., Ta, TaN, Ti, and/or TiN) can be deposited into and lining the trenches 1304. As provided above, use of barrier layer 1401 helps to prevent diffusion of the metal(s) into the surrounding spacers 1302. The terms 'first' and 'second' may also be used herein when referring to (optional) barrier layer 903a and barrier layer 1401. Additionally, a seed layer (not shown) can be deposited into and lining the trench 1304 prior to metal deposition. A seed layer can be used to facilitate plating of the metal into the trench 1304.

As shown in FIG. 14, the present structure includes first metal lines 1102 of a first (subtractive) line type and a second metal line 1402 of a second (damascene) line type in between the first metal lines 1102 having at least two different widths, i.e., W1' and W2', wherein W1'>W2'. Notably, one can also envision the same process steps being performed to instead create first/second metal lines where W1'<W2' by varying the width W1' of the first metal lines 1102, thereby altering the width W2' of the trench 1304/second metal line 1402. Spacers 1302 separate the first metal lines 1102 from the second metal line 1402. It is also notable that, while the figures illustrate a single second metal line 1402, this is done for ease and clarity of depiction. It is to be understood that the present techniques can be employed to form multiple second metal lines 1402, wherein each of the (multiple) second metal lines 1402 is present between two of the first metal lines 1102.

Notably, if the optional barrier layer 903a is employed, it is present only at a bottom of the first metal lines 1102, i.e., the barrier layer 903a separates the first metal lines 1102 from the underlying substrate 902. By contrast, the barrier layer 1401 is present at the bottom and along the sidewalls of the second metal line, i.e., the barrier layer 1401 separates the second metal line 1402 from the underlying substrate 902 as well as from the adjacent spacers 1302. Another notable feature of the present design is that the first metal lines 1102 can be formed from a different metal or a different combination of metals than the second metal line 1402. For instance, the first metal line type can be chosen to optimize the compatibility with a RIE etch and the second metal line type can be chosen for the ability to fill narrow damascene trenches. While employing a different metal(s) for the first/ second metal lines 1102/1402 is possible, embodiments are also contemplated herein where the same metal(s) is/are used for both the first metal lines 1102 and the second metal line 1402.

In the same manner as above, the spacers 1302 may in fact be sacrificial spacers that are used during the damascene process, and then later removed and replaced with final 'replacement' spacers. Doing so has some notable advantages, such as permitting replacement of the spacers 1302 with a different dielectric material, and providing a high-quality dielectric to replace the spacers 1302 that might have become damaged during the fabrication process.

Figure 15:
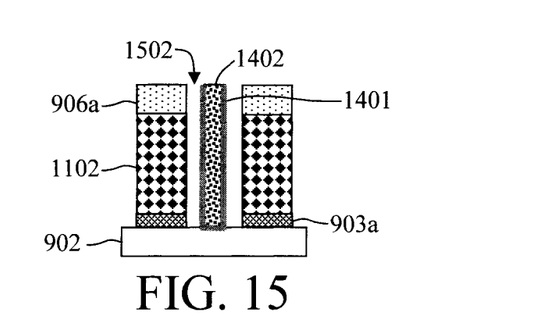
FIG. 15 is a cross-sectional diagram illustrating, according to yet another alternative embodiment, the spacers having been selectively removed according to an embodiment of the present invention.
Figure 16:
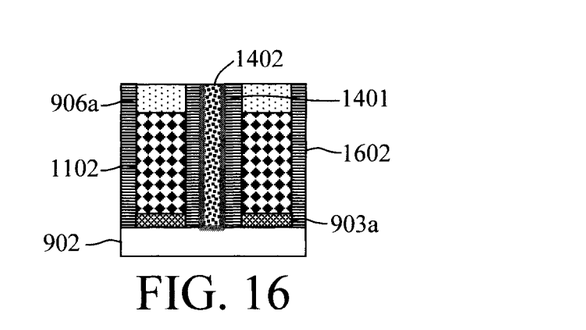
FIG. 16 is a cross-sectional diagram illustrating replacement spacers having been formed in between the first metal lines and the second metal line according to an embodiment of the present invention.

This alternative embodiment is now described by way of reference to FIGS. 15 and 16. What is shown in FIG. 15 follows from the structure shown in FIG. 14, and thus like structures are numbered alike. As shown in FIG. 15, following formation of the second metal line 1402, the spacers 1302 (which in this alternative example are sacrificial spacers) are selectively removed, forming trenches 1502 in between the first metal lines 1102 and the second metal line 1402. The terms 'first' and 'second' may also be used herein when referring to trench 1304 and trenches 1502, respectively. A directional (anisotropic) etching process such as RIE can be employed to selectively remove the spacers 1302. It is notable that some choices in the material selection might facilitate this process. For instance, if an oxide material is selected for capping layer 906a, then use of a nitride material for spacers 1302 would enable selective removal of the spacers 1302. Conversely, if a nitride material is selected for capping layer 906a, then use of an oxide material for spacers 1302 would enable selective removal of the spacers 1302.

A spacer material (SiN, SiON, SiCN, SiOx, SiC and/or SiCO) is then deposited into the trenches 1502 forming (replacement) spacers 1602 in between the first metal lines 1102 and second metal line 1402. See FIG. 16. Following deposition, the spacer material can be planarized using a process such as CMP.

According to an exemplary embodiment, the dielectric material selected for replacement spacers 1602 is different from that used for spacers 1302. However, while employing different dielectric materials for the first/second spacers 1302/1602 is possible, embodiments are also contemplated herein where the same dielectric material is used for both the first spacers 1302 and the second spacers 1602.

Figure 17:
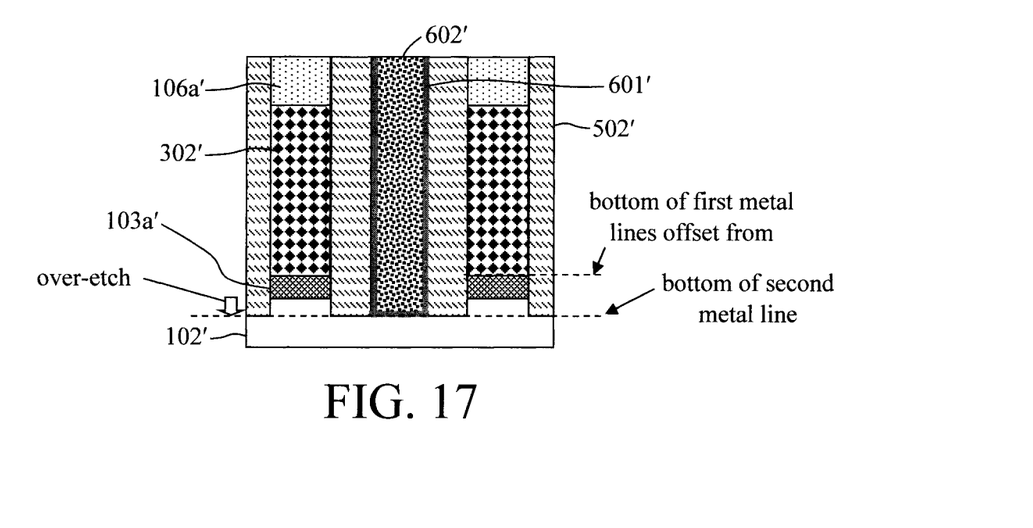
FIG. 17 is a cross-sectional diagram illustrating, according to still yet another alternative embodiment, a bottom of the first metal lines being offset from a bottom of the second metal line according to an embodiment of the present invention.

As provided above, a certain amount of over-etch may be expected during the etch (e.g., RIE) of the subtractive metal lines. As a result, the damascene metal lines formed in between the subtractive metal lines will be deeper, i.e., the bottom of the subtractive metal lines will be offset from a bottom of the damascene metal lines. This scenario is illustrated in FIG. 17. For illustrative purposes only, the structure of the first process flow is used as an example. See, e.g., FIGS. 1-6 (described above). However, this configuration applies to any of the embodiments described herein.

As shown in FIG. 17, some over-etch can occur during the subtractive patterning of first metal lines 302' and (optional) barrier layer 103a' and capping layer 106a' below and above the first metal lines 302', whereby the etch extends partially into the substrate 102'. As a result, when the damascene process is then used to form the second metal line 602' in between the first metal lines 302', the second metal line 602' will be deeper than the first metal lines 302'. Namely, as shown in FIG. 17, the bottom of the first metal lines 302' will be offset from the bottom of the second metal line 602'. Likewise, spacers 502' and barrier layer 601' will extend deeper into the substrate 102' along the sidewall of the second metal line 602'.

As provided above, the spacers that separate the first metal lines from the second metal line can optionally be formed from a combination of layers, such as a bilayer spacer formed from a first dielectric and a second dielectric. With this bilayer spacer configuration, the first dielectric is present along the sidewall of the first metal lines, while the second dielectric is present along the sidewall of the second metal line. This scenario is illustrated in FIG. 18. For illustrative purposes only, the structure of the first process flow is used as an example. See, e.g., FIGS. 1-6 (described above). However, this configuration applies to any of the embodiments described herein.

In the same manner as described above, following subtractive patterning of the first metal lines 302" on substrate 102", spacers are formed along the sidewalls of the first metal lines 302" and along the (optional) barrier layer 103a" and capping layer 106a" below and above the first metal lines 302". In this case, however, the spacers are a bilayer spacer including a first dielectric layer 502a" and a second dielectric layer 502b" disposed over the first dielectric layer 502a". Suitable materials for first dielectric layer 502a" include, but are not limited to, SiN, SiON, SiCN, SiOx, SiC and/or SiCO. A process such as CVD, ALD or PVD can be employed to deposit the first dielectric layer 502a". According to an exemplary embodiment, first dielectric layer 502a" has a thickness of from about 2 nm to about 5 nm and ranges therebetween. Suitable materials for the second dielectric layer 502b" include, but are not limited to, oxide low-κ materials such as SiOx and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit the second dielectric layer 502b". According to an exemplary embodiment, second dielectric layer 502b" has a thickness of from about 5 nm to about 15 nm and ranges therebetween.

As shown in FIG. 18, according to this alternative embodiment, the first dielectric layer 502a" is present along the sidewalls of the first metal lines 302". The second dielectric layer 502b" is present along the sidewalls of the second metal lines 602".

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   first metal lines of a first line type disposed on a substrate; and
   at least one second metal line of a second line type disposed on the substrate between two of the first metal lines with the first metal lines having a pitch X, and the first metal lines in combination with the at least one second metal line having a pitch X/2, wherein the first line type comprises subtractive lines and the second line type comprises damascene lines such that the first metal lines have a different metallization structure from the at least one second metal line.

2. The interconnect structure of claim 1, wherein the first metal lines comprise a metal selected from the group consisting of: cobalt (Co), ruthenium (Ru), tungsten (W), and combinations thereof, and wherein the at least one second metal line comprises a metal selected from the group consisting of: copper (Cu), Co, Ru, W, and combinations thereof.

3. The interconnect structure of claim 1, wherein the different metallization structure comprises the first metal lines having at least one different metal from the at least one second metal line.

4. The interconnect structure of claim 1, wherein the different metallization structure comprises a width W1' of the first metal lines being different from a width W2' of the at least one second metal line.

5. The interconnect structure of claim 4, wherein W1'>W2'.

6. The interconnect structure of claim 1, wherein the different metallization structure comprises the first metal lines having a different line height from the at least one second metal line.

7. The interconnect structure of claim 1, further comprising:
   spacers separating the first metal lines from the at least one second metal line.

8. The interconnect structure of claim 7, wherein the spacers comprise a material selected from the group consisting of: silicon nitride (SiN), silicon oxynitride (SiON), silicon carbide nitride (SiCN), silicon oxide (SiOx), silicon carbide (SiC), silicon oxycarbide (SiCO), and combinations thereof.

9. The interconnect structure of claim 7, wherein the spacers are bilayer spacers each comprising:
   a first dielectric along a sidewall of the first metal lines; and
   a second dielectric along a sidewall of the at least one second metal line.

10. The interconnect structure of claim 1, wherein the different metallization structure comprises:
    a barrier layer present only at a bottom of the first metal lines.

11. The interconnect structure of claim 1, wherein the different metallization structure comprises:
    a first barrier layer present only at a bottom of the first metal lines; and
    a second barrier layer present at a bottom and along sidewalls of the at least one second metal line.

12. The interconnect structure of claim 1, further comprising:
    a capping layer disposed on the first metal lines.

13. The interconnect structure of claim 12, wherein top surfaces of the at least one second metal line and the capping layer are coplanar.

14. The interconnect structure of claim 1, wherein the different metallization structure comprises a bottom of the first metal lines being offset from a bottom of the at least one second metal line.

15. A method of forming an interconnect structure, the method comprising:
    depositing a metal layer onto a substrate;
    subtractive patterning the metal layer into first metal lines; and
    forming at least one second metal line between two of the first metal lines using a damascene process with the first metal lines having a pitch X, and the first metal lines in combination with the at least one second metal line having a pitch X/2.

16. The method of claim 15, further comprising:
    forming spacers alongside the first metal lines with a first trench present between the spacers; and
    forming the at least one second metal lines in the first trench such that the spacers separate the first metal lines from the at least one second metal line.

17. The method of claim 16, wherein the spacers comprise sacrificial spacers, and wherein the method further comprises:
    selectively removing the sacrificial spacers to form second trenches in between the first metal lines and the at least one second metal line; and
    forming replacement spacers in the second trenches.

18. The method of claim 16, further comprising:
    depositing a first barrier layer onto the substrate such that the metal layer is deposited onto the substrate over the first barrier layer, wherein following the subtractive patterning of the metal layer into the first metal lines, the first barrier layer is present only at a bottom of the first metal lines.

19. The method of claim 18, further comprising:
    depositing a second barrier layer into and lining the first trench, wherein, following the forming of the at least one second metal lines in the first trench, the second barrier layer is present at a bottom and along sidewalls of the at least one second metal line.

20. The method of claim 15, further comprising:
    depositing a capping layer onto the metal layer, wherein following the subtractive patterning of the metal layer into the first metal lines, the capping layer is present on each of the first metal lines.

* * * * *